(12) United States Patent
Deng et al.

(10) Patent No.: US 8,256,498 B2
(45) Date of Patent: Sep. 4, 2012

(54) HEAT DISSIPATION APPARATUS HAVING HEAT PIPES INSERTED THEREIN

(75) Inventors: Hong-Bo Deng, Shenzhen (CN); Di-Qiong Zhao, Shenzhen (CN); Ye Chen, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 923 days.

(21) Appl. No.: 12/331,390

(22) Filed: Dec. 9, 2008

(65) Prior Publication Data
US 2009/0314466 A1    Dec. 24, 2009

(30) Foreign Application Priority Data
Jun. 18, 2008    (CN) .......................... 2008 1 0067910

(51) Int. Cl.
F28F 7/00    (2006.01)
H05K 7/20    (2006.01)
(52) U.S. Cl. .................................. 165/80.3; 165/104.21
(58) Field of Classification Search ............ 165/104.21, 165/80.3, 185; 361/697, 700, 709; 257/715; 174/15.2, 16.3
See application file for complete search history.

(56) References Cited

U.S. PATENT DOCUMENTS

| 5,309,983 | A * | 5/1994 | Bailey | 165/80.3 |
| 7,170,746 | B2 * | 1/2007 | Watanabe et al. | 361/697 |
| 7,333,336 | B2 * | 2/2008 | Kim | 361/709 |
| 7,760,501 | B2 * | 7/2010 | Zha et al. | 361/697 |
| 2006/0227506 | A1 * | 10/2006 | Lee et al. | 361/697 |
| 2007/0058343 | A1 * | 3/2007 | Deng et al. | 361/695 |
| 2008/0202729 | A1 * | 8/2008 | Mochizuki | 165/104.14 |
| 2008/0230209 | A1 * | 9/2008 | Khalili et al. | 165/104.33 |
| 2008/0295993 | A1 * | 12/2008 | Chen et al. | 165/80.3 |
| 2009/0242176 | A1 * | 10/2009 | Liu et al. | 165/104.33 |

* cited by examiner

*Primary Examiner* — Tho V Duong
(74) *Attorney, Agent, or Firm* — Altis Law Group, Inc.

(57) ABSTRACT

A heat dissipation apparatus includes a heat sink and a pair of first heat pipes. The heat sink includes a pair of first fin assemblies staggered with a pair of second fin assemblies. The first and second fin assemblies each define a receiving groove therein. The second fin assemblies each further defines an opening communicating with the receiving groove of a corresponding second fin assembly. The first heat pipes each include an evaporation section and a condensation section. A portion of the condensation section of each of the first heat pipes is inserted into the receiving groove of each of the first fin assemblies. The other portion of the condensation section of each of the first heat pipes is received in the receiving groove of each of the second fin assemblies through the opening.

18 Claims, 10 Drawing Sheets

HEAT DISSIPATION APPARATUS HAVING HEAT PIPES INSERTED THEREIN

CROSS-REFERENCE TO RELATED APPLICATION

This application is related to a co-pending application entitled "HEAT DISSIPATION APPARATUS HAVING A FAN RECEIVED THEREIN" Ser. No. 12/331,391, assigned to the same assignee of this application and filed on the same date. The disclosure of the co-pending application is wholly incorporated herein by reference.

BACKGROUND

1. Technical Field

The disclosure generally relates to heat dissipation and, particularly, to a heat dissipation apparatus utilizing a plurality of heat pipes for dissipating heat generated by electronic components.

2. Description of Related Art

It is well known that if heat generated by electronic components, such as integrated circuit chips, during operation is not efficiently dissipated, these electronic components may suffer damage. Thus, heat dissipation apparatuses are often used to cool the electronic components.

A typical heat dissipation apparatus includes a heat sink and a heat pipe attached to the heat sink. The heat pipe is bent to form a plurality of sections, for increasing a contacting surface between the heat sink and the heat pipe. Thus, heat dissipation efficiency of the heat dissipation apparatus can be improved.

However, during assembly, since the heat pipe is bent to form a plurality of sections, it is difficult for the heat pipe to be assembled to the heat sink.

What is needed, therefore, is a heat dissipation apparatus which overcomes the above-described limitations.

BRIEF DESCRIPTION OF THE DRAWINGS

Many aspects of the present heat dissipation apparatus can be better understood with reference to the following drawings. The components in the drawings are not necessarily drawn to scale, the emphasis instead being placed upon clearly illustrating the principles of the disclosed heat dissipation apparatus. Moreover, in the drawings, like reference numerals designate corresponding parts throughout the several views.

DETAILED DESCRIPTION OF THE EMBODIMENTS

Figure 1:
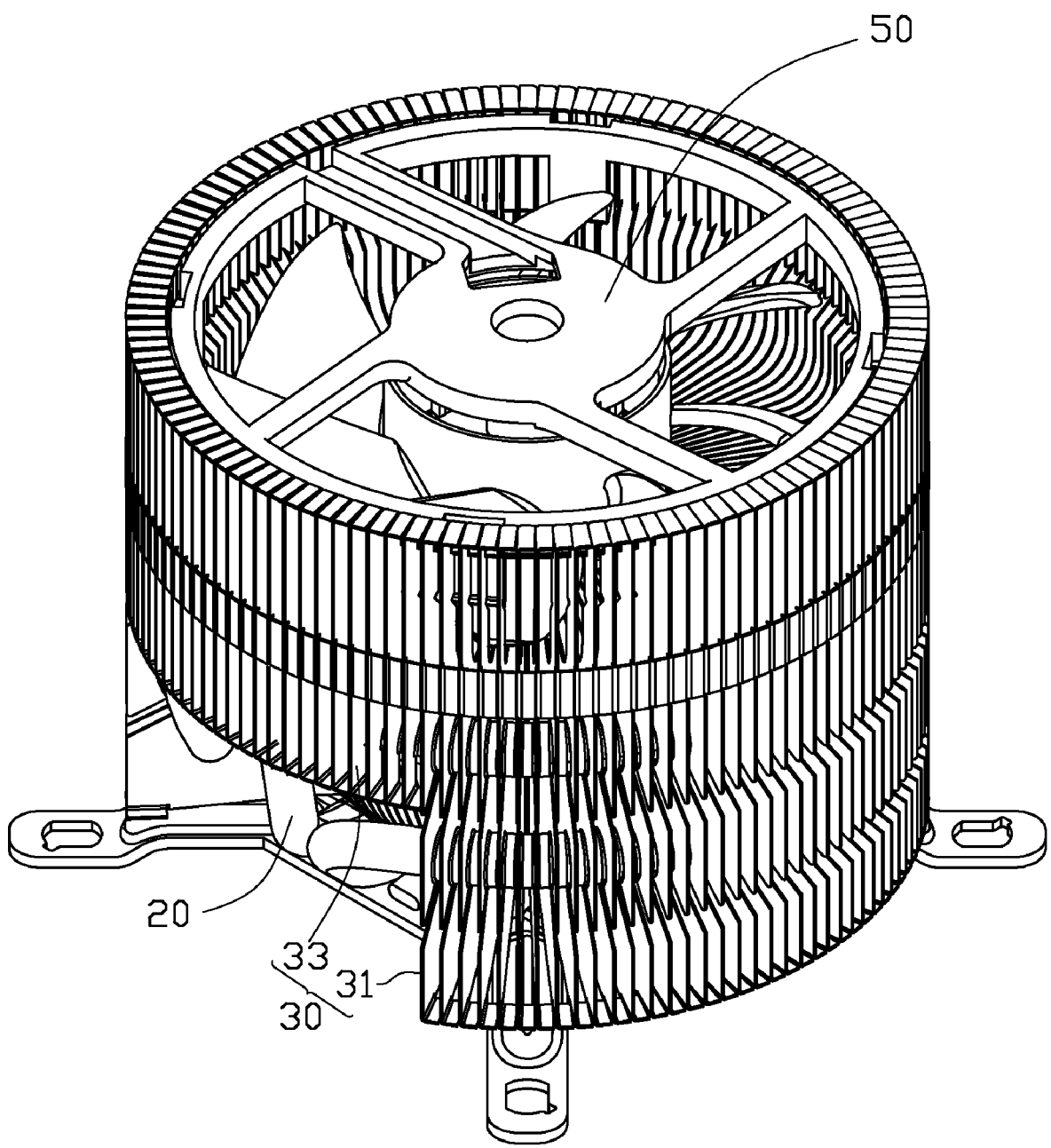
FIG. 1 is an assembled, isometric view of a heat dissipation apparatus in accordance with a first embodiment of the disclosure.
Figure 2:
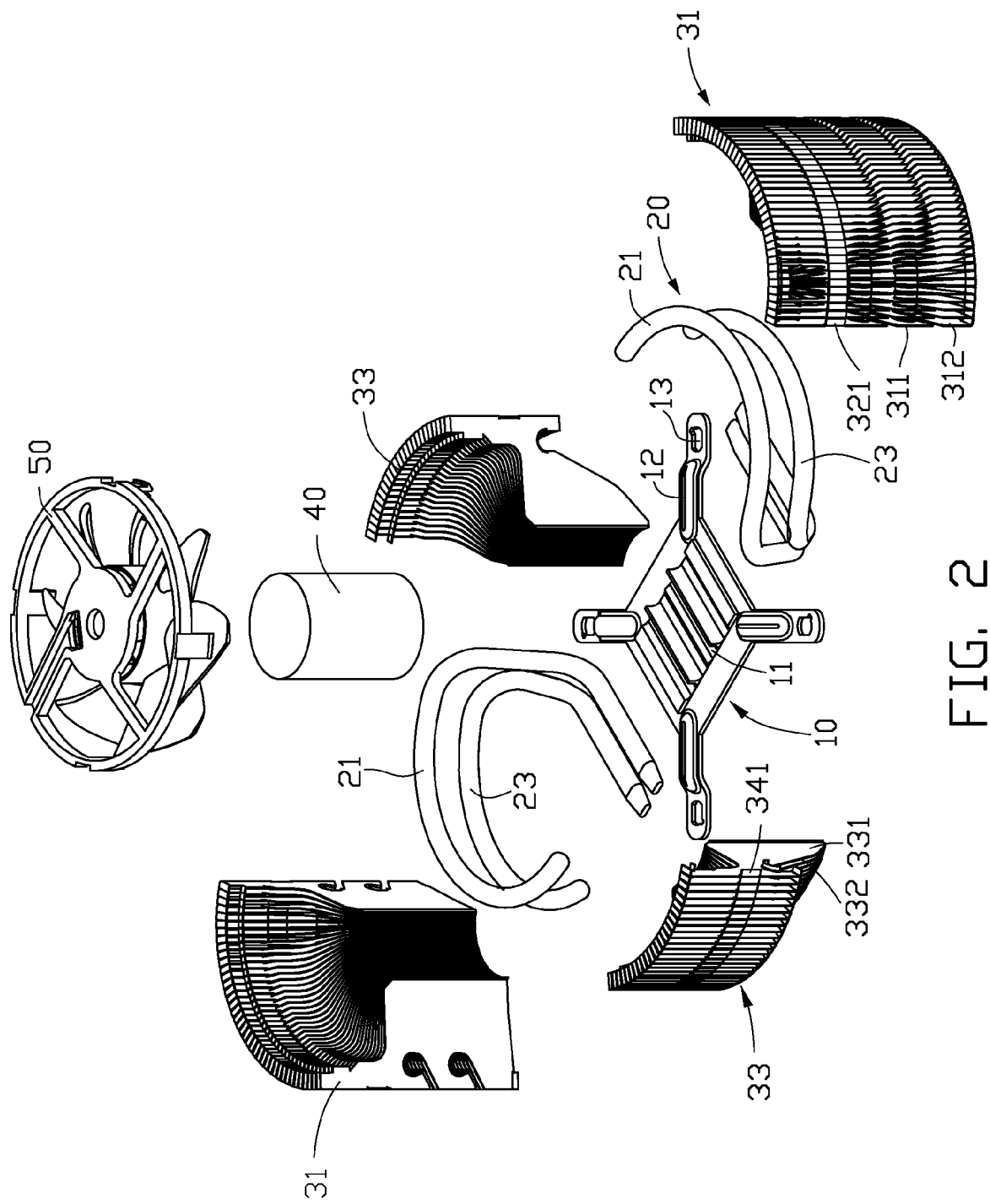
FIG. 2 is an exploded, isometric view of the heat dissipation apparatus of FIG. 1.

Referring to FIGS. 1 and 2, a heat dissipation apparatus in accordance with a first embodiment of the disclosure is shown. The heat dissipation apparatus includes a base 10, a heat sink 30, a heat pipe assembly 20 thermally connecting the base 10 with the heat sink 30, a cylindrical heat conductive core 40 received in the heat sink 30, and a fan 50 mounted in a top of the heat sink 30.

The base 10 is a metal plate, and has a high heat conductivity. Preferably, the base 10 is made of copper. The base 10 thermally connects with a heat generating electronic component at a bottom surface thereof, and attaches to the heat pipe assembly 20 at a top surface thereof. A number of grooves 11 are defined in the top surface of the base 10 for accommodating the heat pipe assembly 20. In this embodiment, the base 10 defines four parallel grooves 11 thereon. A securing arm 12 extending outwardly from each corner of the base 10 defines a securing hole 13 therein for assembly of the heat dissipation apparatus to a circuit board on which the electronic component is mounted.

Figure 3:
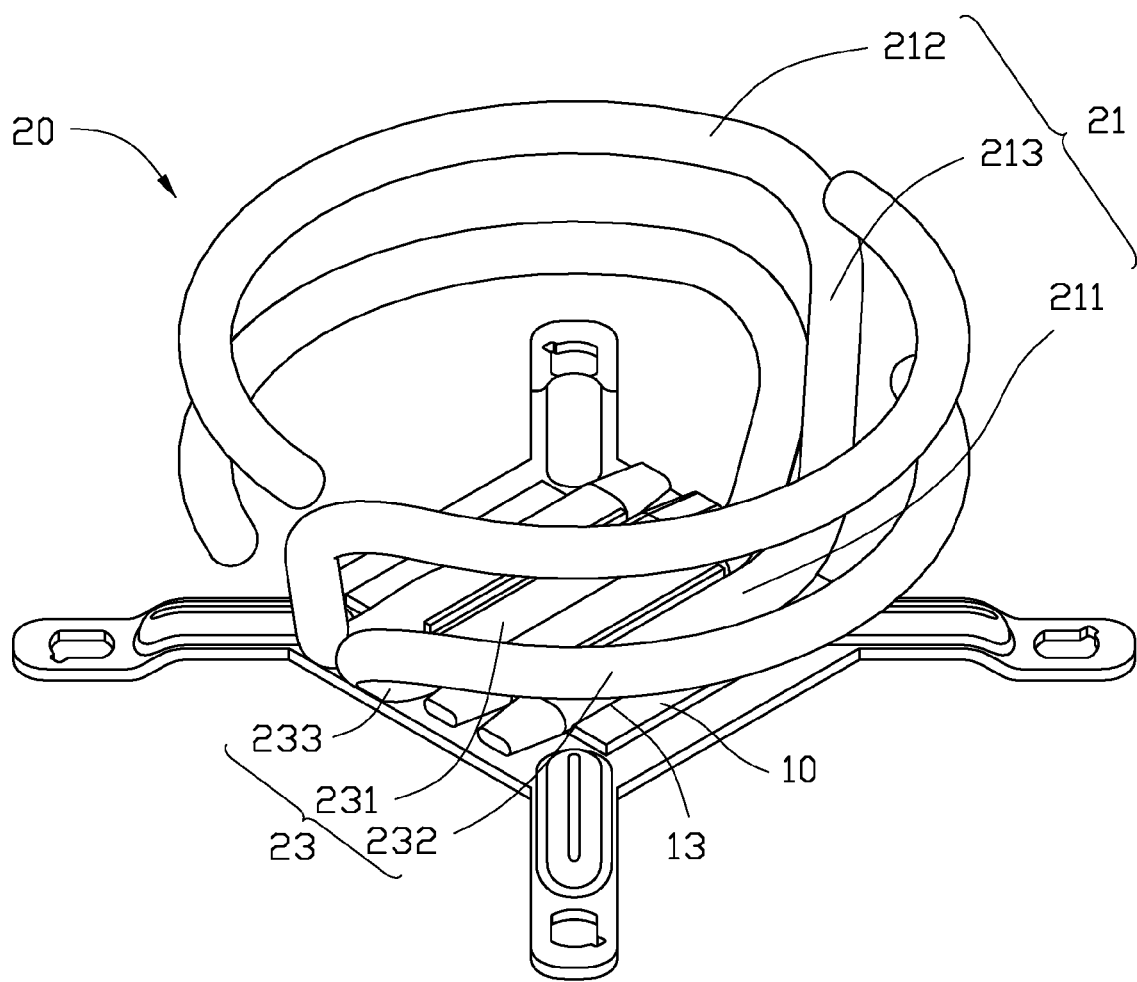
FIG. 3 is an isometric view showing a heat pipe assembly assembled to a base of the heat dissipation apparatus of FIG. 1.

Referring to FIG. 3, the heat pipe assembly 20 includes a pair of first heat pipes 21 and a pair of second heat pipes 23. Each of the first heat pipes 21 is bent to have an evaporation section 211, a condensation section 212, and an adiabatic section 213 interconnecting the evaporation section 211 and the condensation section 212. The evaporation section 211 of each of the first heat pipes 21 is straight and flat, and is mounted in one groove 11 of the top surface of the base 10. The adiabatic section 213 extends upwardly and slantwise from one end of the evaporation section 211. The condensation section 212 is substantially semicircular, and extends from a free end of the adiabatic section 213 along an anticlockwise direction. The evaporation sections 211 of the first heat pipes 21 are arranged in the outmost two grooves 11, the adiabatic sections 213 are located at two opposite sides of the base 10, and the condensation sections 212 are approximately at the same level and cooperatively form a circle.

The second heat pipes 23 are similar to the first heat pipes 21, with each also including an evaporation section 231, a condensation section 232, and an adiabatic section 233 interconnecting the evaporation section 231 and the condensation section 232. The evaporation sections 231 of the second heat pipes 23 are arranged in the middle two grooves 11 of the base 10. A free end of the adiabatic section 233 of each second heat pipe 23 is lower than that of each first heat pipe 21. The condensation sections 232 of the second heat pipes 23 are at the same level, and lower than the condensation sections 212 of the first heat pipes 21. Similarly, the condensation sections 232 of the second heat pipes 23 cooperatively form a circle. A plane defined by the condensation sections 232 of the second heat pipes 23 is parallel to a plane defined by the condensation sections 212 of the first heat pipes 21.

The heat sink 30 is annular, and includes a pair of first fin assemblies 31 and a pair of second fin assemblies 33.

Figure 4:
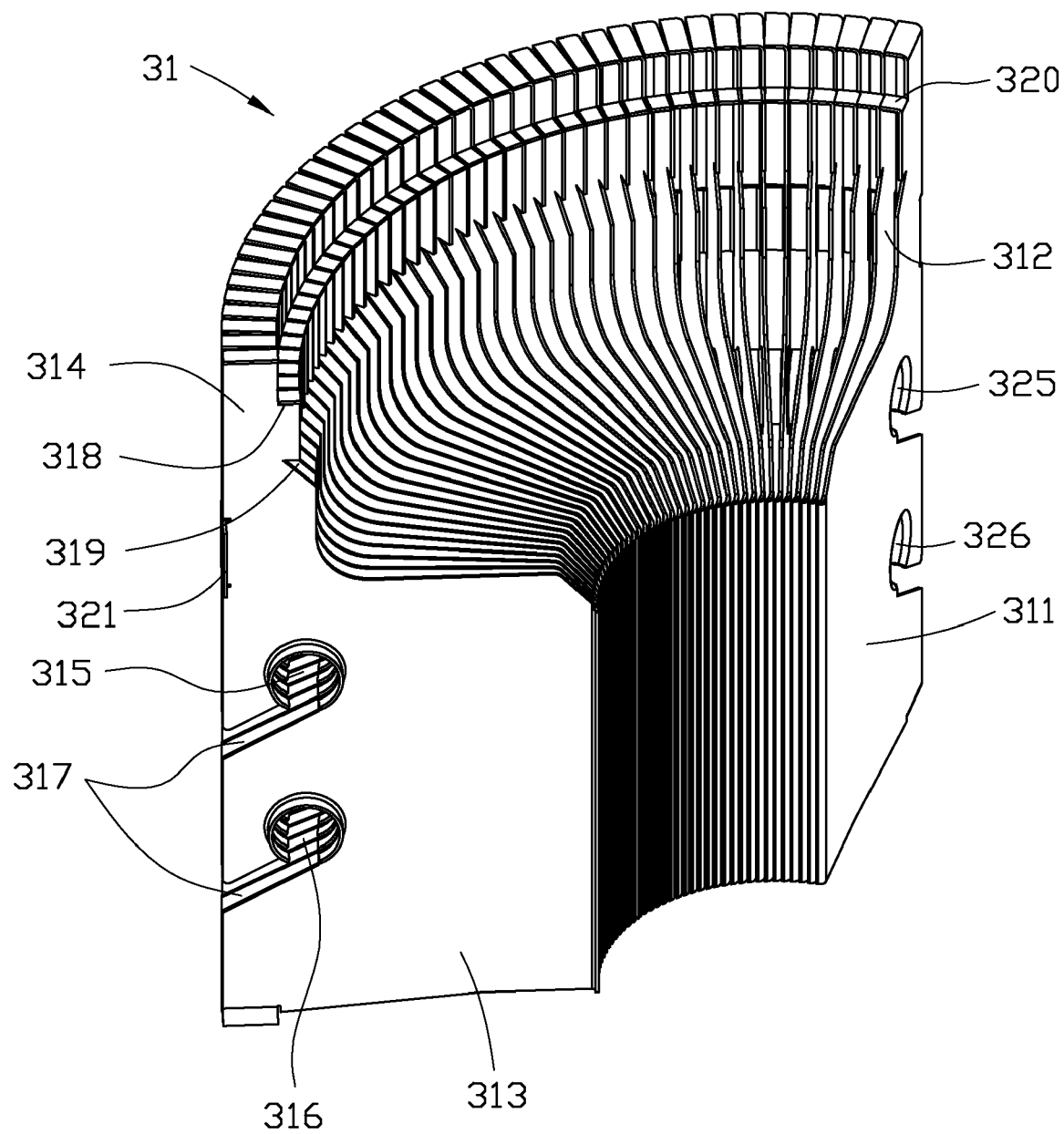
FIG. 4 is an enlarged view of a first fin assembly of the heat dissipation apparatus of FIG. 1.

Referring to FIG. 4, each of the first fin assemblies 31 is sectorial, and includes a plurality of stacked first fins 311. An air channel 312 is defined between every two adjacent first fins 311. Each of the first fins 311 includes a rectangular main body 313 and an extension arm 314 extending upwardly from an outer side of the main body 313.

The main body 313 defines a first receiving hole 315 and a second receiving hole 316 below the first receiving hole 315. All the first receiving holes 315 of the first fins 311 cooperatively form an arcuate first receiving groove 325 of the first fin assembly 31, for receiving the condensation section 212 of the first heat pipe 21 therein. All the second receiving holes 316 of the first fins 311 cooperatively form a second receiving groove 326 of the first fin assembly 31, for receiving the condensation section 232 of the second heat pipe 23 therein. The main body 313 further defines two up-slantwise adding grooves 317 communicating with the first and second receiving holes 315, 316, respectively, whereby solders can be conveniently added through the adding grooves 317 when the first and second heat pipes 21, 23 are soldered onto the first fin assembly 31.

The extension arm 314 forms a step portion 318 and defines an engaging groove 319 at an inner side thereof. A width of the extension arm 314 below the step portion 318 is greater than a width of the extension arm 314 above the step portion 318. A step flange 320 extends perpendicularly out from the step portion 318. The engaging groove 319 is wedgy, and located below the step portion 318. The engaging groove 319 and the step portion 318 are used to secure the fan 50 onto the heat sink 30. The extension arm 314 forms perpendicularly out an airflow pressure flange 321 at an outer side thereof, for increasing an airflow pressure of the fan 50.

Figure 5:
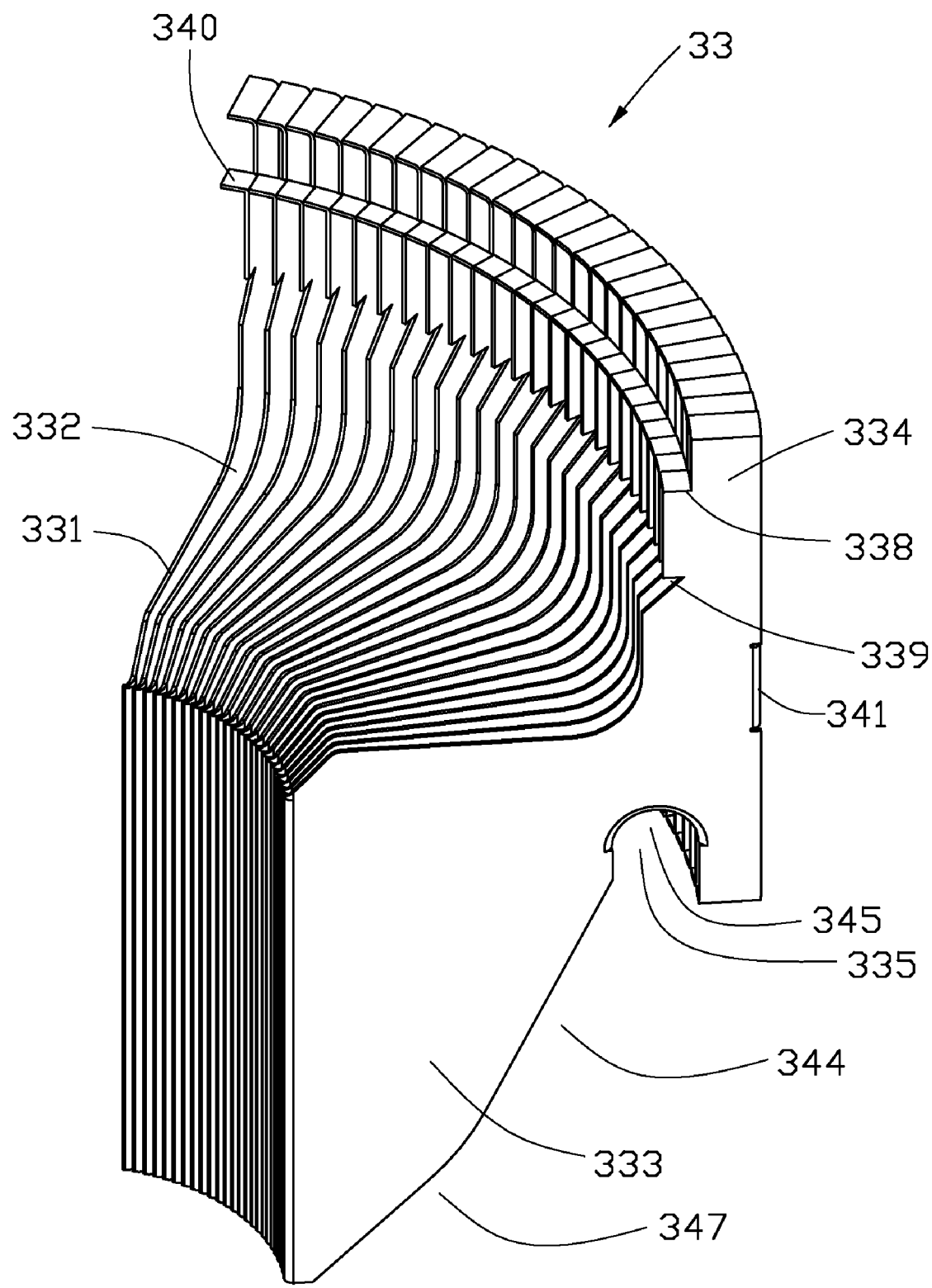
FIG. 5 is an enlarged view of a second fin assembly of the heat dissipation apparatus of FIG. 1.

Referring to FIG. 5, the second fin assemblies 33 are similar to the first fin assemblies 31, with each also being sectorial, and including a plurality of stacked second fins 331. An air channel 332 is defined between every two adjacent second fins 331. Each of the second fins 331 includes a main body 333 and an extension arm 334. The extension arm 334 is the same as the extension arm 314 of the first fin 311, also including a step portion 338, an engaging groove 339, a step flange 340 and an airflow pressure flange 341. The difference between the second fin assemblies 33 and the first fin assemblies 31 is that the main body 333 of the second fin 331 is substantially triangular, and thus defines a cutout 344 at an outer-down side thereof. In addition, the main body 333 defines only one receiving hole 335 therein aligning with the first receiving hole 315 of the first fin 311. The receiving hole 335 is in communication with the cutout 344. All the receiving holes 335 of the second fins 331 cooperatively form an arcuate receiving groove 345 of the second fin assembly 33, for receiving the condensation section 212 of the first heat pipe 21 therein. All the cutouts 344 of the second fins 331 cooperatively form an opening 347 of the second fin assembly 33, such that the first heat pipe 21 can be put into the receiving groove 345 therefrom conveniently.

Figure 6:
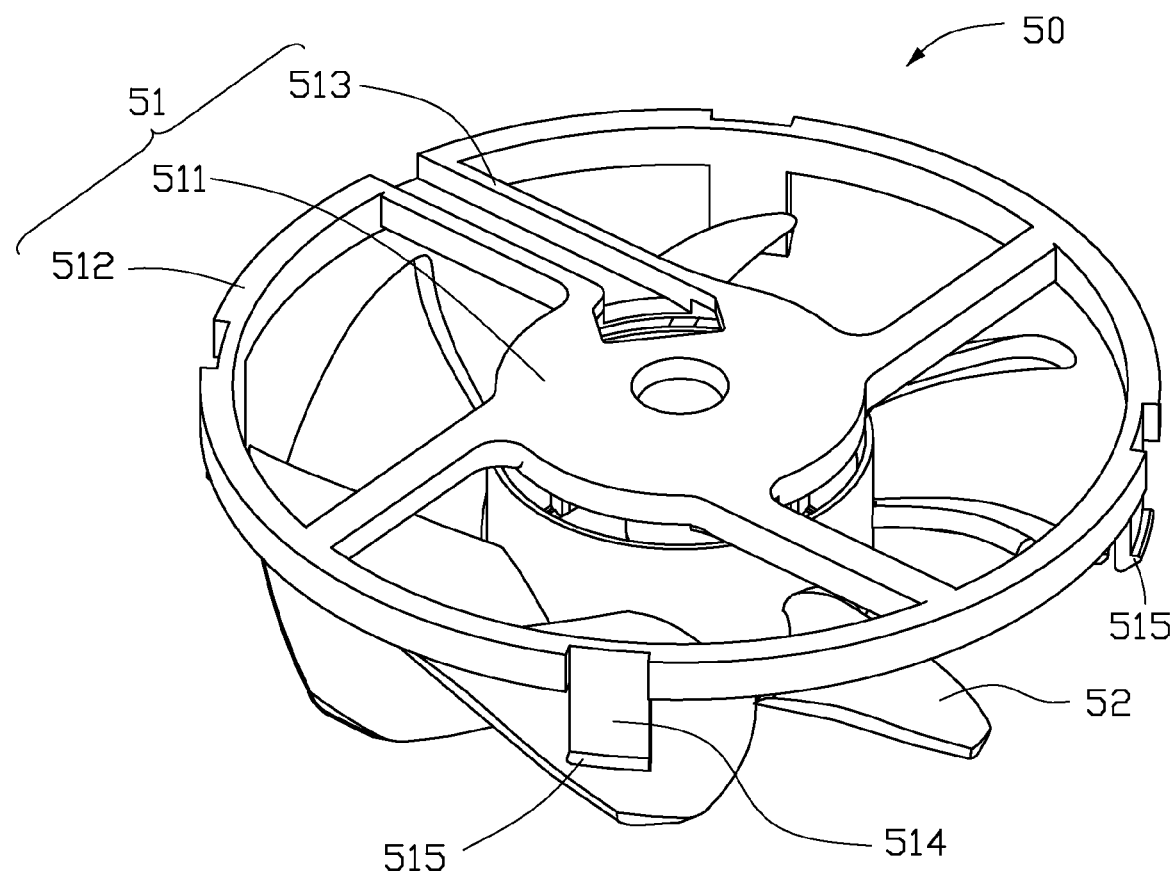
FIG. 6 is an enlarged view of a fan of the heat dissipation apparatus of FIG. 1.

Referring to FIG. 6, the fan 50 includes a frame 51 and an impeller 52 mounted on the frame 51. The frame 51 includes a holder 511 at a center thereof, a rim 512 at an outer periphery thereof, and a plurality of ribs 513 connecting the holder 511 with the rim 512. The holder 511 is used to support the impeller 52. The rim 512 is annular, and extends perpendicularly and downwardly out a plurality of legs 514. The legs 514 are evenly arranged on the rim 512. A hook 515 extends radially out from a free end of each leg 514. The hook 515 matches with the engaging grooves 319, 339 of the first and second fin assemblies 31, 33, for mounting the fan 50 into the heat sink 30.

Figure 7:
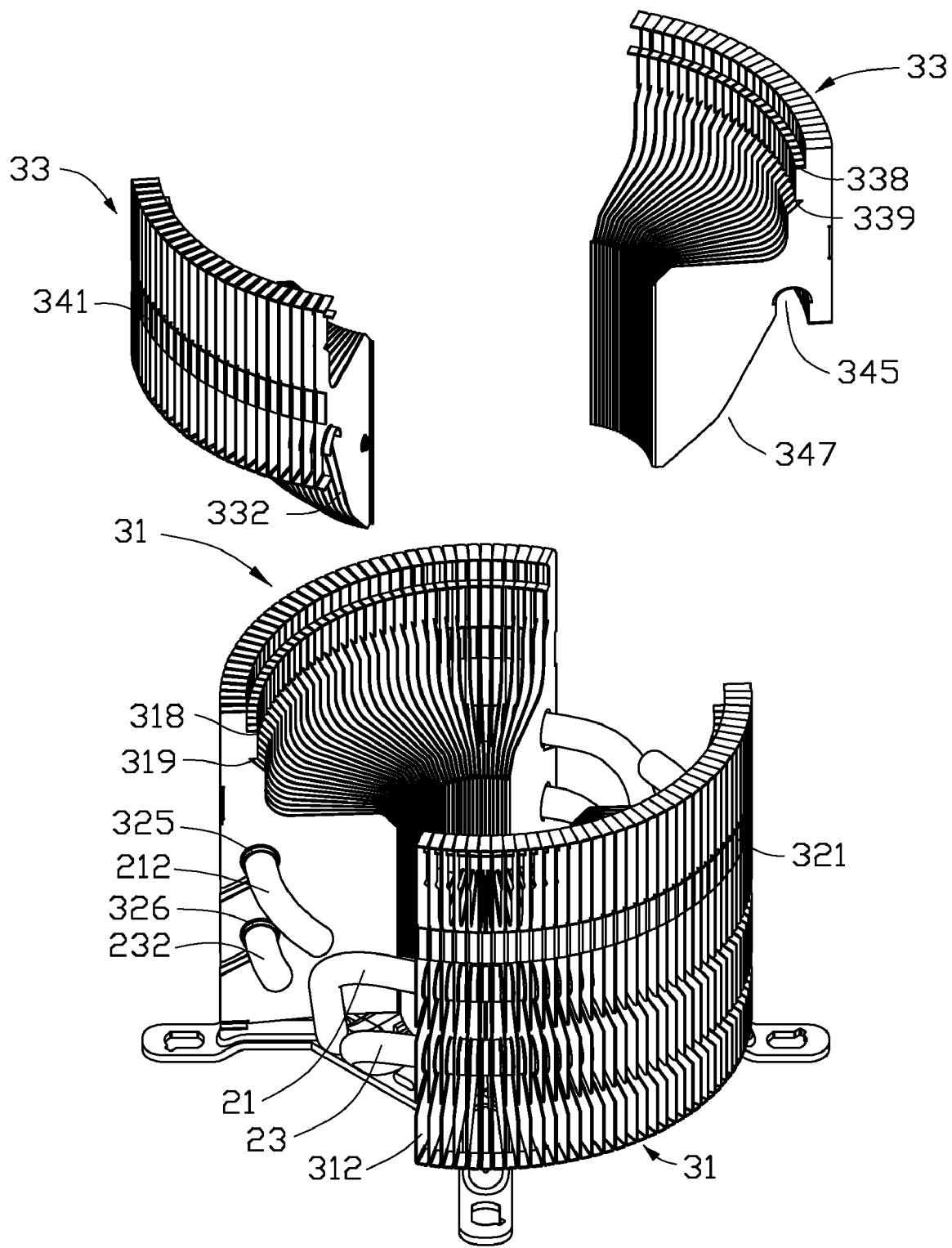
FIG. 7 is an isometric view showing a pair of first fin assemblies as shown in FIG. 4 assembled to the heat pipe assembly of the heat dissipation apparatus of FIG. 1, and a pair of second fin assemblies disassembled from the heat pipe assembly.
Figure 8:
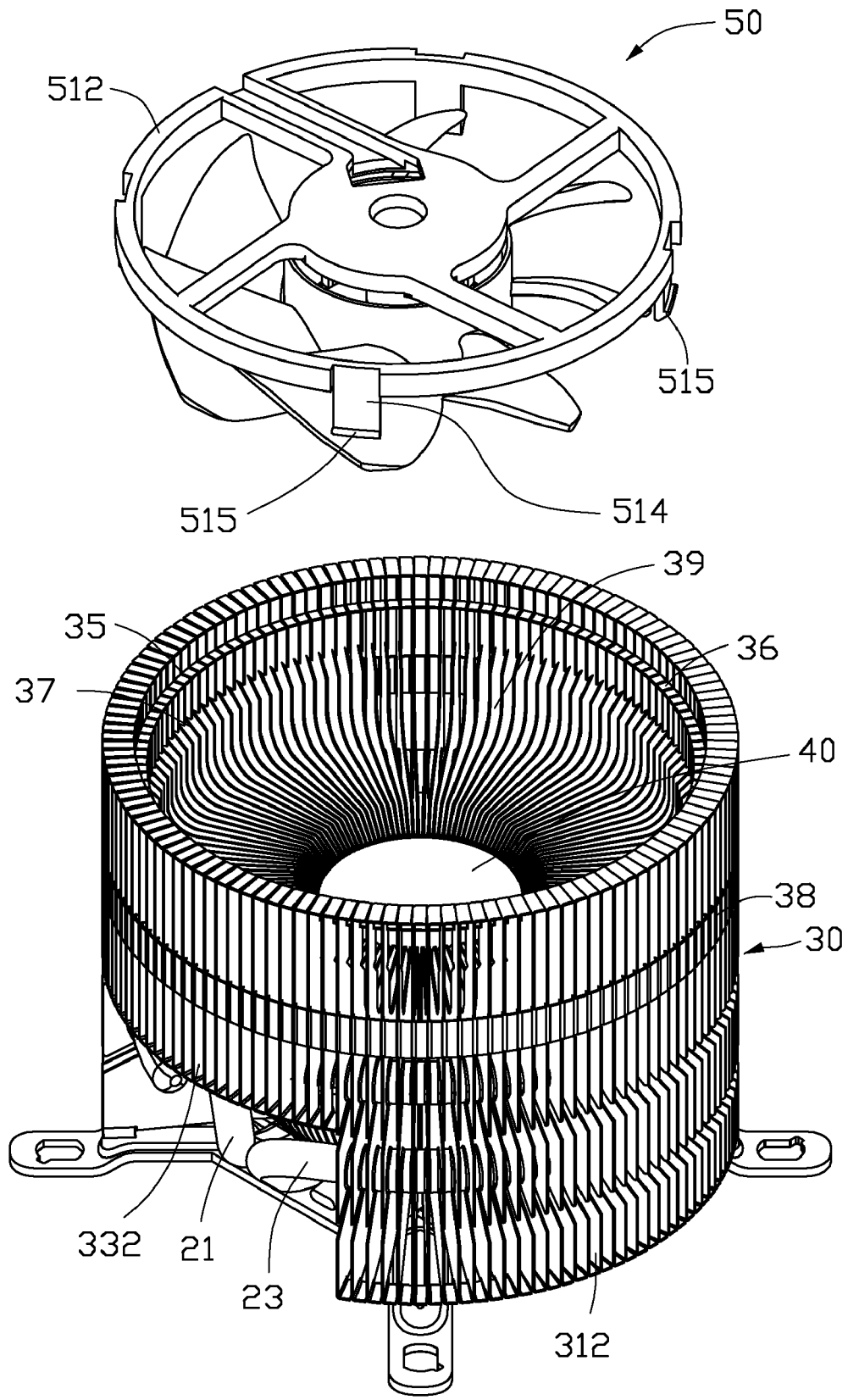
FIG. 8 is an isometric view showing a heat conductive core assembled to the heat dissipation apparatus of FIG. 7, and the fan of FIG. 7 disassembled from the heat dissipation apparatus of FIG. 1.

Referring to FIGS. 7 and 8, during assembly of the heat dissipation apparatus, the first fin assemblies 31 are oriented face to face, and space from each other. The condensation sections 212 of the pair of the first heat pipes 21 are inserted into the first receiving grooves 325 of the first fin assemblies 31 along two opposite orientations, respectively. The condensation sections 232 of the pair of the second heat pipes 23 are inserted into the second receiving grooves 326 of the first fin assemblies 31 along two opposite orientations, respectively. A free end of each condensation section 212, 232 protrudes out of a corresponding first fin assembly 31. The first fin assemblies 31, and the first and second heat pipes 21, 23 are arranged on the base 10, with the evaporation sections 211, 231 of the first and second heat pipes 21, 23 received in the grooves 11 of the base 10.

The second fin assemblies 33 are inserted into spaces between the first fin assemblies 31 from top to bottom, respectively. The free end of each condensation section 212 of the first heat pipes 21 enters into and is received in the receiving groove 345 through the opening 347 of the second fin assembly 33. The free end of each condensation section 232 of the second heat pipes 23, and the adiabatic section 213, 233 of each first and second heat pipe 21, 23 are received in the opening 347. At this time, the first fin assemblies 31 and the second fin assemblies 33 are staggered with each other, and cooperatively form the annular heat sink 30. All the step portions 318, 338 of the first and second fin assemblies 31, 33 cooperatively form an annular step 35 of the heat sink 30. All the step flanges 320, 340 of the first and second fin assemblies 31, 33 cooperatively form an annular and horizontal step flange 36 of the heat sink 30. All the engaging grooves 319, 339 of the first and second fin assemblies 31, 33 cooperatively form an annular engaging groove 37 of the heat sink 30. All the airflow pressure flanges 321, 341 of the first and second fin assemblies 31, 33 cooperatively form an annular airflow pressure flange 38 of the heat sink 30.

The heat conductive core 40 is enclosed by the first and second fin assemblies 31, 33. The heat conductive core 40 attaches to the evaporation sections 211, 231 of the first and second heat pipes 21, 23 at a bottom surface thereof, and attaches to inner surfaces of the first and second fin assemblies 31, 33 at a side surface thereof. The first and second fins 311, 331 of the first and second fin assemblies 31, 33 extend out from the heat conductive core 40 in a radial pattern. The main bodies 313, 333 and the extension arms 314, 334 of the first and second fin assemblies 31, 33, and the heat conductive core 40 cooperatively form a recessed space 39 at a top end of the heat sink 30. The annular step 35 and the annular step flange 36 are located in the space 39. The annular engaging groove 37 communicates with the space 39.

The fan 50 is aligned with and pressed into the space 39, with the hooks 515 of the legs 514 of the fan 50 fastened into the engaging groove 37, for mounting the fan 50 in the heat sink 30. At this time, bottom and side surfaces of the rim 512 of the fan 50 abuts the annular step flange 36 and an inner side of the heat sink 30, respectively. The impeller 52 is received in the space 39.

During operation of the heat dissipation apparatus, the base 10 absorbs heat from the heat generating electronic component, which is transferred to the heat sink 30 via the heat conductive core 40 and the heat pipe assembly 20. The fan 50 produces airflow toward the heat sink 30, and dissipates heat from the heat sink 30 into ambient air.

In the heat dissipation apparatus, since the heat sink 30 includes a pair of first fin assemblies 31 and a pair of second fin assemblies 33, the heat pipe assembly 20 can be assembled into the first and second fin assemblies 31, 33 successively.

Thus, the heat dissipation apparatus is conveniently assembled even though the first and second heat pipes 21, 23 are bent to form a plurality of sections. In addition, a part of heat from the heat generating electronic component is transferred to the heat sink 30 via the heat conductive core 40 from a middle of the heat sink 30, and another part of heat is transferred to the heat sink 30 via the heat pipe assembly 20 from an outer peripheral portion of the heat sink 30. Thus, the heat is evenly distributed on the heat sink 30, and heat dissipation efficiency of the heat dissipation apparatus is improved. Furthermore, the fan 50 is mounted in the space 39 of the heat sink 30, and the impeller 52 is enclosed by the heat sink 30, which makes the most of the cool airflow produced by the fan 50 flow through the first and second fins 311, 331. Meanwhile, the heat sink 30 enclosing the fan 50 severs as a sidewall of the typical fan, which saves material of the fan 50 and increases pressure of the airflow produced by the fan 50. The annular airflow pressure flange 38 further increases the pressure of the airflow. Moreover, the heat sink 30 includes the step 35 and the engaging groove 37, and the fan 50 includes the rim 512 and the legs 514 with hooks 515. Thus, additional screws are not required to steadily mount the fan 50 on the heat sink 30, which simplifies structure of the heat dissipation apparatus. The first and second fins 311, 331 of the first and second fin assemblies 31, 33 extend out from the heat conductive core 40 in a radial pattern. The airflow produced by the fan 50 is easily guided toward other heat generating electronic components around the heat sink 30 through the airflow channels 312, 332 between the first and second fins 311, 331. Thus, the heat dissipation apparatus not only takes heat away from the heat sink 30, but also dissipates heat from the heat generating electronic components around the heat sink 30.

Figure 9:
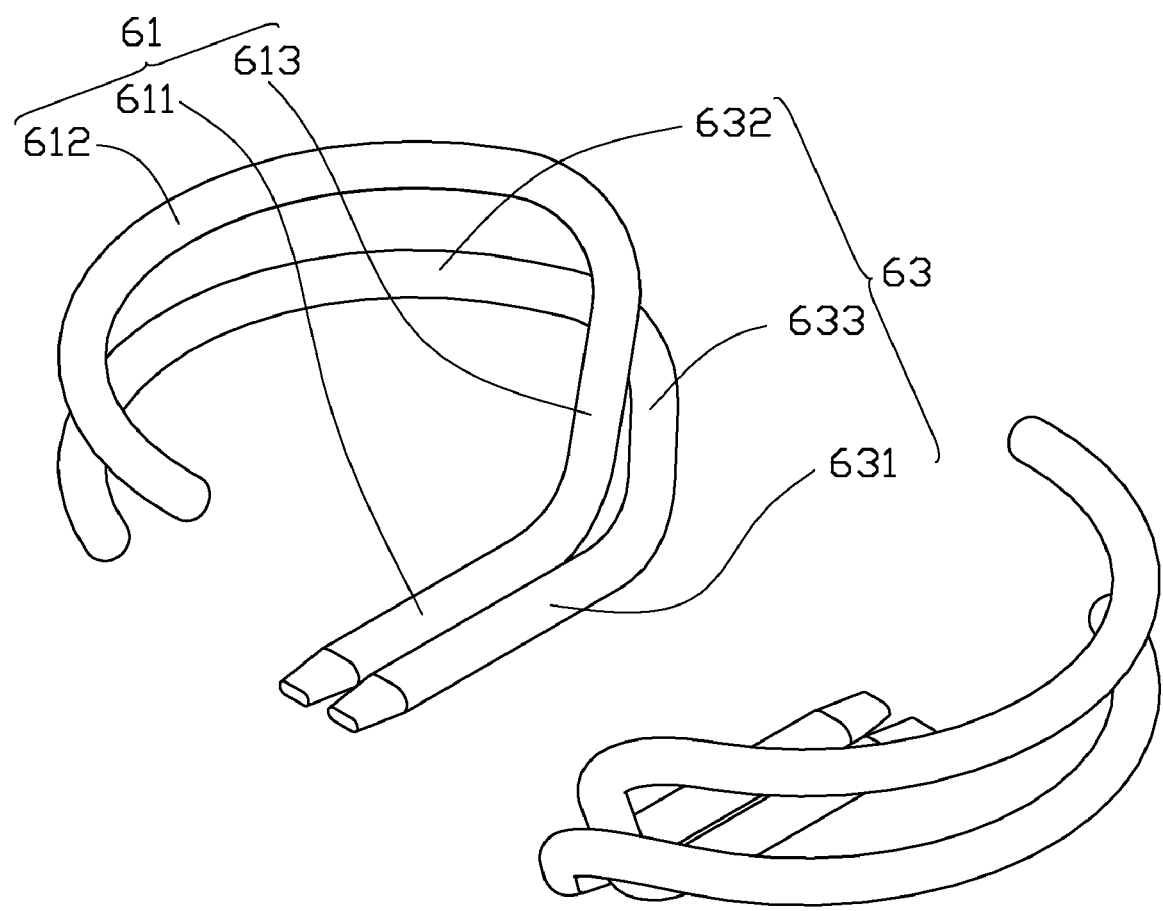
FIG. 9 is an exploded, isometric view of a heat pipe assembly of a heat dissipation apparatus in accordance with a second embodiment of the disclosure.

Alternatively, the first and second heat pipes 21, 23 can be other shapes. Referring to the FIG. 9, first and second heat pipes 61, 63 of a heat dissipation apparatus in accordance with a second embodiment of the disclosure are shown. The heat dissipation apparatus of the second embodiment differs from the first embodiment only in that an angle formed between the evaporation section 631 and the adiabatic section 633 of the second heat pipe 63 is greater than that of the first heat pipe 61.

Figure 10:
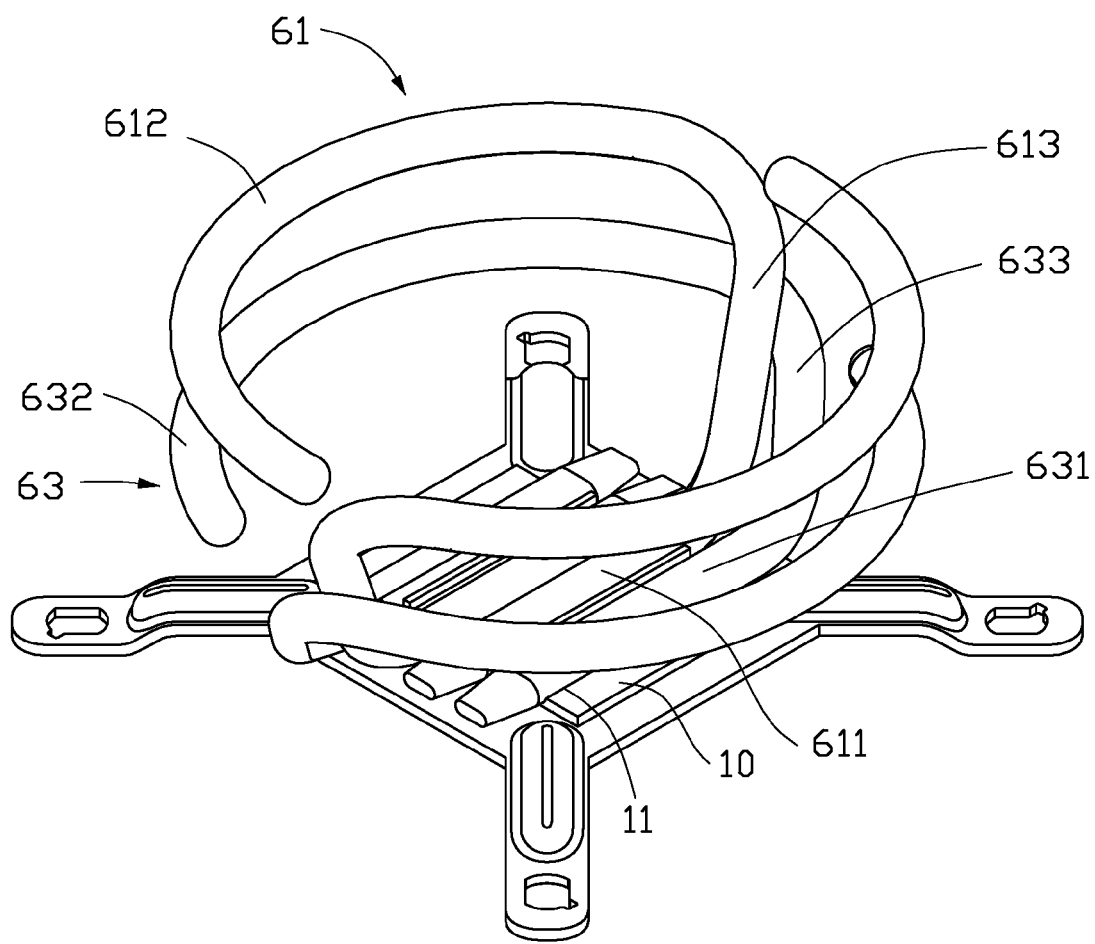
FIG. 10 is an isometric view showing the heat pipe assembly of FIG. 9 assembled to a base of the heat dissipation apparatus of FIG. 2.

Referring to the FIG. 10, during assembly, the evaporation sections 611 of the first heat pipes 61 are arranged in the middle two grooves 11 of the base 10. The evaporation sections 631 of the second heat pipes 63 are arranged in the outmost two grooves 11 of the base 10. The adiabatic sections 633 of the second heat pipes 63 steer clear of an outer side of the adiabatic sections 613 of the first heat pipes 61. A circle formed by the condensation sections 632 of the second heat pipes 63 is larger than a circle formed by the condensation sections 612 of the first heat pipes 61. Accordingly, the position of the receiving grooves of the first and second fin assemblies should be adjusted corresponding to the shape of the first and second heat pipes 61, 63.

It is believed that the disclosure and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation apparatus, comprising:
  a heat sink comprising a pair of first fin assemblies, and a pair of second fin assemblies staggered with the pair of first fin assemblies, the first and second fin assemblies each defining a first receiving groove therein, the second fin assemblies each further defining an opening communicating with the first receiving groove of a corresponding second fin assembly;
  a pair of first heat pipes each comprising an evaporation section and a condensation section, a portion of the condensation section of each of the first heat pipes being inserted into the first receiving groove of one of the first fin assemblies, another portion of the condensation section of each of the first heat pipes being received in the first receiving groove of one of the second fin assemblies through the opening, and the condensation sections of the first heat pipes cooperatively forming a circle; and
  a pair of second heat pipes each comprising an evaporation section and a condensation section, each of the first fin assemblies further comprising a second receiving groove for receiving the condensation section of one of the second heat pipes, and the condensation sections of the second heat pipes cooperatively forming a circle.

2. The heat dissipation apparatus of claim 1, wherein the condensation sections of the first heat pipes are capable of being inserted into the first fin assemblies along two opposite orientations, respectively.

3. The heat dissipation apparatus of claim 1, wherein each of the first fin assemblies comprises a plurality of first fins, each of the second fin assemblies comprises a plurality of second fins, and each of the first and second fins comprises a main body and an extension arm extending upwardly from an outer side of the main body.

4. The heat dissipation apparatus of claim 3, wherein each of the second fins defines a cutout at an outer-down side thereof, and all the cutouts of the second fins cooperatively form the opening of each of the second fin assemblies.

5. The heat dissipation apparatus of claim 1, wherein the condensation sections of the second heat pipes are capable of being inserted into the first fin assemblies along two opposite orientations, respectively.

6. The heat dissipation apparatus of claim 1, wherein each of the first heat pipes further comprises an adiabatic section interconnecting the evaporation section and the condensation section, each of the second heat pipes further comprises an adiabatic section interconnecting the evaporation section and the condensation section, and the condensation sections of the first heat pipes are higher than the condensation sections of the second heat pipes.

7. The heat dissipation apparatus of claim 6, wherein the adiabatic section of each of the first heat pipes extends upwardly and slantwise from one end of the evaporation section of each of the first heat pipes, the adiabatic section of each of the second heat pipes extends upwardly and slantwise from one end of the evaporation section of each of the second heat pipes, the evaporation sections of the first heat pipes are arranged between the evaporation sections of the second heat pipes.

8. The heat dissipation apparatus of claim 6, wherein the adiabatic section of each of the first heat pipes extends upwardly and slantwise from one end of the evaporation section of each of the first heat pipes, the adiabatic section of each of the second heat pipes extends upwardly and slantwise from one end of the evaporation section of each of the second heat pipes, the adiabatic sections of the second heat pipes steer clear of an outer side of the adiabatic sections of the first heat pipes.

9. The heat dissipation apparatus of claim 1, wherein each of the first fin assemblies further defines two up-slantwise adding grooves communicating with the two receiving grooves, respectively.

10. The heat dissipation apparatus of claim 1, further comprising a heat conductive core, wherein the first and second fin assemblies cooperatively form an annular structure; the heat conductive core is enclosed by the first and second fin assemblies, and attached to inner surfaces of the first and second fin assemblies at a side surface thereof.

11. The heat dissipation apparatus of claim 1, further comprising a fan, wherein the first and second fin assemblies cooperatively define a recessed space at a top end of the heat sink, the fan being mounted in the space.

12. The heat dissipation apparatus of claim 11, wherein the first and second fin assemblies cooperatively define an engaging groove, the fan comprises a frame and an impeller mounted on the frame, the frame extending downwardly out a plurality of legs, each of the legs comprises a hook at a free end thereof, the hook being engaged in the engaging groove of the heat sink for fastening the fan on the heat sink.

13. The heat dissipation apparatus of claim 12, wherein the frame comprises an annular rim from which the legs is extended out, the first and second fin assemblies form a step which the rim abuts.

14. A heat dissipation apparatus, comprising:
a base;
a heat sink, mounted on the base, comprising a pair of first fin assemblies, and a pair of second fin assemblies staggered with the pair of first fin assemblies, the first and second fin assemblies each defining a first receiving groove therein, the second fin assemblies each further defining an opening communicating with the first receiving groove of a corresponding second fin assembly, the heat sink having a space defined therein;
a pair of first heat pipes, mounted on the base, each of the first heat pipes comprising an evaporation section and a condensation section, a portion of the condensation section of each of the first heat pipes being inserted into the first receiving groove of one of the first fin assemblies, another portion of the condensation section of each of the first heat pipes being received in the first receiving groove of one of the second fin assemblies through the opening and the condensation sections of the first heat pipes cooperatively forming a circle;
a pair of second heat pipes each comprising an evaporation section and a condensation section, each of the first fin assemblies further comprising a second receiving groove for receiving the condensation section of one of the second heat pipes, and the condensation sections of the second heat pipes cooperatively forming a circle; and
a heat core received in the space.

15. The heat dissipation apparatus of claim 14, wherein the condensation sections of the first heat pipes are capable of being inserted into the first fin assemblies along two opposite orientations, respectively.

16. The heat dissipation apparatus of claim 14, wherein each of the first fin assemblies comprises a plurality of first fins, each of the second fin assemblies comprises a plurality of second fins, and each of the first and second fins comprises a main body and an extension arm extending upwardly from an outer side of the main body.

17. The heat dissipation apparatus of claim 16, wherein each of the second fins defines a cutout at an outer-down side thereof, and all the cutouts of the second fins cooperatively form the opening of each of the second fin assemblies.

18. The heat dissipation apparatus of claim 14, further comprising a pair of second heat pipes mounted on the base, each of the second heat pipes comprising an evaporation section and a condensation section, each of the first fin assemblies further comprising a second receiving groove for receiving the condensation section of one of the second heat pipes.

* * * * *